United States Patent
Akiyama et al.

(10) Patent No.: US 7,736,748 B2
(45) Date of Patent: Jun. 15, 2010

(54) INSULATING-FILM-FORMING COMPOSITION, METHOD OF PRODUCING THE SAME, SILICA-BASED INSULATING FILM, AND METHOD OF FORMING THE SAME

(75) Inventors: Masahiro Akiyama, Tsukuba (JP); Hisashi Nakagawa, Tsukuba (JP); Takahiko Kurosawa, Tsukuba (JP); Atsushi Shiota, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 801 days.

(21) Appl. No.: 11/580,959

(22) Filed: Oct. 16, 2006

(65) Prior Publication Data

US 2007/0031687 A1 Feb. 8, 2007

Related U.S. Application Data

(63) Continuation of application No. PCT/JP2005/008222, filed on Apr. 28, 2005.

(30) Foreign Application Priority Data

May 11, 2004 (JP) ............................. 2004-141200
Feb. 17, 2005 (JP) ............................. 2005-040460

(51) Int. Cl.
 B32B 27/00 (2006.01)
 B32B 9/04 (2006.01)
 C08L 83/00 (2006.01)
 C08G 77/04 (2006.01)

(52) U.S. Cl. ........................... 428/447; 528/10; 528/33; 528/34

(58) Field of Classification Search .................. 428/447; 528/33, 34
See application file for complete search history.

(56) References Cited

U.S. PATENT DOCUMENTS

| | | | |
|---|---|---|---|
| 6,204,202 B1 | 3/2001 | Leung et al. | |
| 6,207,266 B1 | 3/2001 | Kanbara et al. | |
| 6,225,238 B1* | 5/2001 | Wu | 438/778 |
| 6,239,042 B1 | 5/2001 | Sonego et al. | |
| 6,274,515 B1 | 8/2001 | Hughes et al. | |
| 6,599,635 B1* | 7/2003 | Mechtel et al. | 428/449 |
| 6,613,834 B2 | 9/2003 | Nakata et al. | |
| 6,807,041 B2 | 10/2004 | Geiger et al. | |
| 6,809,041 B2 | 10/2004 | Interrante et al. | |
| 6,933,360 B2* | 8/2005 | Ko et al. | 528/30 |
| 6,958,525 B2 | 10/2005 | Nakata | |
| 7,528,207 B2* | 5/2009 | Nakagawa et al. | 528/21 |
| 2002/0198353 A1* | 12/2002 | Chen et al. | 528/10 |
| 2003/0003288 A1* | 1/2003 | Nakata et al. | 428/304.4 |
| 2004/0109950 A1* | 6/2004 | Adams et al. | 427/387 |
| 2004/0180188 A1* | 9/2004 | Nakata et al. | 428/312.6 |
| 2005/0096415 A1 | 5/2005 | Akiyama et al. | |
| 2006/0006541 A1 | 1/2006 | Tsuchiya et al. | |
| 2006/0024980 A1 | 2/2006 | Tsuchiya et al. | |
| 2006/0063905 A1* | 3/2006 | Nakagawa et al. | 528/12 |
| 2006/0127587 A1 | 6/2006 | Kang et al. | |
| 2006/0134336 A1* | 6/2006 | Nakagawa et al. | 427/387 |
| 2006/0210812 A1* | 9/2006 | Shiota | 428/447 |
| 2006/0275614 A1* | 12/2006 | Shiota | 428/447 |
| 2007/0015892 A1* | 1/2007 | Nakagawa et al. | 528/25 |
| 2007/0020467 A1* | 1/2007 | Nakagawa et al. | 428/447 |
| 2007/0021580 A1* | 1/2007 | Nakagawa et al. | 528/34 |
| 2007/0027287 A1* | 2/2007 | Akiyama et al. | 528/35 |
| 2007/0088144 A1 | 4/2007 | Kang et al. | |
| 2008/0038527 A1* | 2/2008 | Akiyama et al. | 428/219 |
| 2008/0268264 A1* | 10/2008 | Akiyama et al. | 428/447 |

FOREIGN PATENT DOCUMENTS

| | | |
|---|---|---|
| JP | 05-263045 | 10/1993 |
| JP | 05-315319 | 11/1993 |
| JP | 11-340219 | 12/1999 |
| JP | 11-340220 | 12/1999 |
| JP | 2001-127152 | 5/2001 |
| JP | 2001-345317 | 12/2001 |
| JP | 2002-69375 | 3/2002 |
| JP | 2002-129103 | 5/2002 |
| WO | WO 02/098955 | 12/2002 |

OTHER PUBLICATIONS

U.S. Appl. No. 11/596,295, filed Nov. 13, 2006, Akiyama, et al.
U.S. Appl. No. 11/596,188, filed Nov. 13, 2006, Akiyama, et al.
"Starfire® SP-DEPCS", Starfire® Systems, www.starfiresystems.com, May 2005, p. 1.
"Starfire® SP-DMPCS", Starfire® Systems, www.starfiresystems.com, May 2005, p. 1.
"Specialty Chemicals", Starfire Systems, (1), p. 1.

(Continued)

*Primary Examiner*—Randy Gulakowski
*Assistant Examiner*—Robert Loewe
(74) *Attorney, Agent, or Firm*—Oblon, Spivak, McClelland, Maier & Neustadt, L.L.P.

(57) ABSTRACT

An insulating-film-forming composition including an organic solvent and a hydrolysis-condensation product which is obtained by hydrolysis and condensation of a component (A) in the presence of a component (B).

17 Claims, No Drawings

OTHER PUBLICATIONS

"Specialty Chemicals", Starfire Systems, (2), p. 1.
"Internet Archive WayBack Machine", http://web.archive.org/web/*/http://www.starfiresystems.com, p. 1.
"Starfire Systems: Projects, Specialty Chemicals", http://web.archive.org/web/20011205120755/www.starfiresystems.com/projects/chemicals.html, p. 1-2.
U.S. Appl. No. 12/278,224, filed Aug. 4, 2008, Nakagawa, et al.
U.S. Appl. No. 11/423,345, filed May 12, 2006, Shiota.
U.S. Appl. No. 11/393,647, filed Mar. 31, 2006, Shiota.
U.S. Appl. No. 11/484,604, filed Jul. 12, 2006, Nakagawa, et al.
U.S. Appl. No. 11/485,508, filed Jul. 13, 2006, Nakagawa, et al.
U.S. Appl. No. 11/486,085, filed Jul. 14, 2006, Nakagawa, et al.
U.S. Appl. No. 11/489,468, filed Jul. 20, 2006, Akiyama, et al.
U.S. Appl. No. 12/473,861, filed May 28, 2009, Nobe, et al.
U.S. Appl. No. 12/527,327, filed Aug. 14, 2009, Nakagawa, et al.

* cited by examiner

INSULATING-FILM-FORMING COMPOSITION, METHOD OF PRODUCING THE SAME, SILICA-BASED INSULATING FILM, AND METHOD OF FORMING THE SAME

CROSS REFERENCE TO RELATED APPLICATION

This application is a continuation of International Patent Application No. PCT/JP2005/008222, having an international filing date of Apr. 28, 2005, which designated the United States, the entirety of which is incorporated herein by reference. Japanese Patent Application No. 2004-141200, filed on May 11, 2004, and Japanese Patent Application No. 2005-40460, filed on Feb. 17, 2005, are also incorporated herein by reference in their entirety.

BACKGROUND OF THE INVENTION

The present invention relates to an insulating-film-forming composition, a method of producing the same, a silica-based insulating film, and a method of forming the same. More particularly, the invention relates to an insulating-film-forming composition suitably used for an interlayer dielectric of a semiconductor device or the like, a method of producing the same, a silica-based insulating film, and a method of forming the same.

Silica ($SiO_2$) films formed by a vacuum process such as a CVD process have been extensively used as an interlayer dielectric film in the manufacture of semiconductor devices and the like. In recent years, in order to form an interlayer dielectric having a more uniform thickness, a spin-on-glass (SOG) film, which is a coating-type insulating film containing a tetraalkoxysilane hydrolyzate as the major component, has also been used. Along with an increase in the degree of integration of a semiconductor device, a low-relative-dielectric-constant interlayer dielectric called an organic SOG containing a polyorganosiloxane as the major component has been developed.

However, more excellent electrical insulation between conductors has been demanded accompanying a further increase in the degree of integration and multi-layering of a semiconductor device. Therefore, an interlayer dielectric exhibiting excellent storage stability, a lower relative dielectric constant, and superior mechanical strength has been in demand.

In the manufacturing process for semiconductor devices, a chemical mechanical planarization (CMP) step for planarizing an insulating layer and a washing step are conducted. For this reason, in addition to the dielectric constant characteristics, mechanical strength and chemical resistance of a degree to resist corrosion with a chemical fluid are demanded for application to an interlayer dielectric and a protective film of semiconductor devices.

A composition containing a mixture of fine particles obtained by the condensation of an alkoxysilane in the presence of ammonia and a basic partial hydrolyzate of an alkoxysilane (JP-A-5-263045, and JP-A-5-315319) and a coating solution obtained by the condensation of a basic hydrolyzate of polyalkoxysilane in the presence of ammonia (JP-A-11-340219 and JP-A-11-340220) have been proposed as materials having a low relative dielectric constant. However, the materials obtained by these methods are not suitable for industrial manufacture because of unstable properties of the reaction products and fluctuation of film characteristics such as a relative dielectric constant, cracking resistance, mechanical strength, and adhesion.

A method for forming an insulating film with a low dielectric constant from a coating solution prepared by mixing a polycarbosilane solution and a polysiloxane solution has been proposed (JP-A-2001-127152 and JP-A-2001-345317). This method, however, has a problem in that carbosilane domains and polysiloxane domains are unevenly scattered in the coating film.

A method of using an organosilicate polymer obtained by hydrolysis-condensation of a carbon bridge-containing silane oligomer which is prepared from an organometallic silane compound has been proposed (WO 2002/98955). The material obtained by this method produces a reaction product with poor stability and cannot be stored for a long period of time. In addition, the coating exhibits poor adhesion to a substrate.

A method of forming a low-dielectric-constant insulating film by hydrolysis-condensation of a highly branched polycarbosilane (U.S. Pat. No. 6,807,041) has been proposed. However, since the method requires an aging treatment with ammonia, a trimethylsilylization treatment, curing at a high temperature of 500° C., and the like after applying the polymer to a substrate, the method is unsuitable for practical use.

SUMMARY

An object of the invention is to provide an insulating-film-forming composition which may be suitably used for semiconductor devices and the like for which an increase in the degree of integration and in the number of layers has been demanded and can form an insulating film having a low relative dielectric constant and excellent mechanical strength, storage stability, and chemical resistance, and a method of producing the same.

Another object of the invention is to provide a silica-based insulating film having a low relative dielectric constant and excellent mechanical strength, storage stability, chemical resistance, and the like, and a method of forming the same.

An insulating-film-forming composition according to one embodiment of the invention comprises an organic solvent and a hydrolysis-condensation product which is obtained by hydrolysis and condensation of a component (A) in the presence of a component (B), the component (A) being at least one silane compound selected from a group consisting of compounds shown by the following formulas (1) to (3),

wherein R represents a hydrogen atom, a fluorine atom, or a monovalent organic group, $R^1$ represents a monovalent organic group, and a represents an integer of 1 or 2,

wherein $R^2$ represents a monovalent organic group,

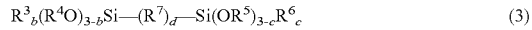

wherein $R^3$ to $R^6$ individually represent monovalent organic groups, b and c individually represent integers from 0 to 2, $R^7$ represents an oxygen atom, a phenylene group, or a group $—(CH_2)_m—$ (wherein m represents an integer from 1 to 6), and d represents 0 or 1, the component (B) being a polycarbosilane having a main chain structure shown by the formula $—(Si—CH_2)_x—$ and containing a structure shown by the following formula (4), a structure shown by the following formula (5), a structure shown by the following formula (6), and a structure shown by the following formula (7),

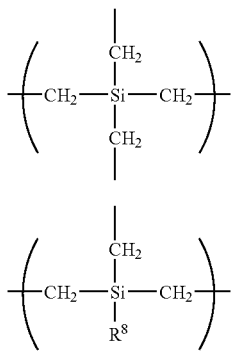

(4)

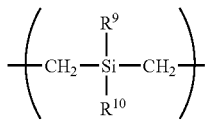

(5)

wherein $R^8$ is selected from a group consisting of a hydrogen atom, a halogen atom, a hydroxyl group, an alkoxyl group, and an acyloxyl group,

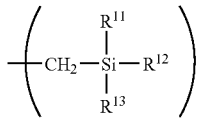

(6)

wherein $R^9$ and $R^{10}$ are individually selected from the group consisting of a hydrogen atom, a halogen atom, a hydroxyl group, an alkoxyl group, and an acyloxyl group,

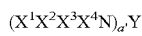

(7)

wherein $R^{11}$ to $R^{13}$ are individually selected from the group consisting of a hydrogen atom, a halogen atom, a hydroxyl group, an alkoxyl group, and an acyloxyl group.

In this insulating-film-forming composition, the amount of the component (B) may be 1 to 1,000 parts by weight for 100 parts by weight of the component (A), converted into a complete hydrolysis-condensation product.

In this insulating-film-forming composition, the component (B) may contain in its molecule 5 to 20 mol % of the structure shown by the formula (4), 5 to 20 mol % of the structure shown by the formula (5), 20 to 50 mol % of the structure shown by the formula (6), and 30 to 60 mol % of the structure shown by the formula (7).

In this insulating-film-forming composition, the component (B) may have a polystyrene-reduced weight average molecular weight of 700 to 10,000.

In this insulating-film-forming composition, the component (B) may not contain a silicon atom other than the silicon atoms included in the structures shown by the formulas (4) to (7) in the molecule.

In this insulating-film-forming composition, the hydrolysis and condensation may be carried out in the presence of a basic catalyst, an acidic catalyst, or a metal chelate catalyst. In this case, the basic catalyst may be a nitrogen-containing compound shown by the following formula (8), $$(X^1X^2X^3X^4N)_{a'}Y \qquad (8)$$

wherein $X^1$, $X^2$, $X^3$, and $X^4$ are individually selected from the group consisting of a hydrogen atom, an alkyl group having 1 to 20 carbon atoms, a hydroxyalkyl group, an aryl group, and an arylalkyl group; Y represents a halogen atom or an anionic group with a valence of 1 to 4; and a' indicates an integer from 1 to 4.

According to one embodiment of the invention, there is provided a method of producing an insulating-film-forming composition including a hydrolysis-condensation product and an organic solvent, the hydrolysis-condensation product being obtained by hydrolysis and condensation of a component (A) in the presence of a component (B), the component (A) being at least one silane compound selected from a group consisting of compounds shown by the following formulas (1) to (3), $$R_a Si(OR^1)_{4-a} \qquad (1)$$

wherein R represents a hydrogen atom, a fluorine atom, or a monovalent organic group, $R^1$ represents a monovalent organic group, and a represents an integer of 1 or 2, $$Si(OR^2)_4 \qquad (2)$$

wherein $R^2$ represents a monovalent organic group, $$R^3{}_b(R^4O)_{3-b}Si—(R^7)_d—Si(OR^5)_{3-c}R^6{}_c \qquad (3)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1, the component (B) being a polycarbosilane having a main chain structure shown by the formula —$(Si—CH_2)_x$— and containing a structure shown by the following formula (4), a structure shown by the following formula (5), a structure shown by the following formula (6), and a structure shown by the following formula (7),

(4)

(5)

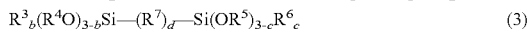

wherein $R^8$ is selected from a group consisting of a hydrogen atom, a halogen atom, a hydroxyl group, an alkoxyl group, and an acyloxyl group,

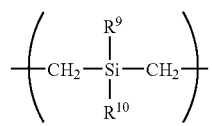

(6)

wherein $R^9$ and $R^{10}$ are individually selected from the group consisting of a hydrogen atom, a halogen atom, a hydroxyl group, an alkoxyl group, and an acyloxyl group,

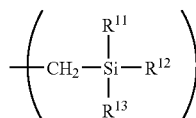

wherein $R^{11}$ to $R^{13}$ are individually selected from the group consisting of a hydrogen atom, a halogen atom, a hydroxyl group, an alkoxyl group, and an acyloxyl group.

In this method of producing an insulating-film-forming composition, the amount of the component (B) is 1 to 1,000 parts by weight for 100 parts by weight of the component (A), converted into a complete hydrolysis-condensation product.

In this method of producing an insulating-film-forming composition, the hydrolysis and condensation may be carried out in the presence of a basic catalyst, an acidic catalyst, or a metal chelate catalyst. In this case, the basic catalyst may be a nitrogen-containing compound shown by the following formula (8), $$(X^1 X^2 X^3 X^4 N)_{a'} Y \qquad (8)$$

wherein $X^1$, $X^2$, $X^3$, and $X^4$ are individually selected from the group consisting of a hydrogen atom, an alkyl group having 1 to 20 carbon atoms, a hydroxyalkyl group, an aryl group, and an arylalkyl group; Y represents a halogen atom or an anionic group with a valence of 1 to 4; and a' indicates an integer from 1 to 4.

A method of forming a silica-based insulating film according to one embodiment of the invention comprises:

applying the above-described insulating-film-forming composition to a substrate to form a coating film; and
curing the coating film by at least one curing treatment selected from heating, electron beam irradiation, ultraviolet irradiation, and oxygen plasma treatment.

A silica-based insulating film according to one embodiment of the invention is obtained by the above-described method of forming a silica-based insulating film.

The insulating-film-forming composition according to one embodiment of the invention contains a hydrolysis-condensation product obtained by hydrolysis and condensation of the component (A) in the presence of the component (B). In the hydrolysis and condensation, the component (A) hydrolyzes to form a silanol group (—Si—OH) and, at the same time, a silanol group is also produced in the component (B) by hydrolysis. The silanol group can form an Si—O—Si bond by condensation. When the component (B) has a silanol group or produces a silanol group by hydrolysis, the hydrolysis-condensation reaction proceeds in substance. However, depending on the structure of the component (B), a major amount of the silanol groups in the component (B) may remain as is without condensing. Not only does the product have poor storage stability, but also an insulating film prepared from such a product has an unduly high dielectric constant due to the presence of the silanol groups and moisture adsorption by the silanol groups. However, according to the film-forming composition of this embodiment, since the component (B) contains the structure shown by the above formula (4), the structure shown by the above formula (5), the structure shown by the above formula (6), and the structure shown by the above formula (7), a three-dimensionally highly-branched high-molecular-weight hydrolysis-condensation product having good storage stability and a low dielectric constant can be obtained by sufficiently condensing the component (B) with the component (A). Therefore, an insulating film having a low dielectric constant can be formed by using the insulating-film-forming composition.

The hydrolysis-condensation product has a structure in which the component (B) is incorporated in a three-dimensional structure by forming a chemical bond with the polysiloxane originating from the component (A). Therefore, an insulating film having high mechanical strength, excellent adhesion, superior chemical resistance, and freedom from film layer separation can be obtained by using the insulating-film-forming composition.

Since the method of producing an insulating-film-forming composition according to one embodiment of the invention can produce a hydrolysis-condensation product under comparatively mild conditions by the hydrolysis-condensation of the component (A) in the presence of the component (B), the reaction can be easily controlled.

The method of forming a silica-based insulating film according to one embodiment of the invention includes applying the above-described insulating-film-forming composition to a substrate to form a coating film, and curing the coating film by at least one curing treatment selected from heating, electron beam irradiation, ultraviolet irradiation, and oxygen plasma treatment. The obtained silica-based insulating film has a low relative dielectric constant, possesses excellent mechanical strength, adhesion, and chemical resistance, and is free from film layer separation.

DETAILED DESCRIPTION OF THE EMBODIMENT

Some embodiments of the invention will now be described in detail.

1. Film-Forming Composition and Process of Producing the Same

The film-forming composition (insulating-film-forming composition) according to one embodiment of the invention contains a hydrolysis-condensation product obtained by hydrolysis and condensation of the component (A) in the presence of the component (B) (hereinafter referred to as "specific hydrolysis-condensation product") and an organic solvent. Each component is described below in detail.

1.1 Component (A)

The component (A) is at least one silane compound selected from the compounds shown by the following formula (1) (hereinafter referred to as "compound 1"), the compounds shown by the following formula (2) (hereinafter referred to as "compound 2"), and the compounds shown by the following formula (3) (hereinafter referred to as "compound 3").

$$R_a Si(OR^1)_{4-a} \qquad (1)$$

wherein R represents a hydrogen atom, a fluorine atom, or a monovalent organic group, $R^1$ represents a monovalent organic group, and a represents an integer of 1 or 2.

$$Si(OR^2)_4 \qquad (2)$$

wherein $R^2$ represents a monovalent organic group.

$$R^3{}_b(R^4O)_{3-b}Si—(R^7)_d—Si(OR^5)_{3-c}R^6{}_c \qquad (3)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

1.1.1 Compound 1

As the monovalent organic groups represented by R and $R^1$ in the formula (1), an alkyl group, an alkenyl group, and an aryl group can be given. As examples of the alkyl group, a methyl group, an ethyl group, a propyl group, a butyl group, and the like can be given. The alkyl group preferably has 1 to 5 carbon atoms. The alkyl group may be either linear or branched. As examples of the alkenyl group in the formula (1), a vinyl group, an allyl group, and the like can be given. As examples of the aryl group in the formula (1), a phenyl group, naphthyl group, methylphenyl group, ethylphenyl group, chlorophenyl group, bromophenyl group, fluorophenyl group, and the like can be given.

As specific examples of the compound 1, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, (n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, vinyltri-n-propoxysilane, vinyltripropoxysilane, vinyltri-n-butoxysilane, vinyltri-sec-butoxysilane, vinyltri-tert-butoxysilane, vinyltriphenoxysilane, trimethoxysilane, triethoxysilane, tri-n-propoxysilane, tripropoxysilane, tri-n-butoxysilane, tri-sec-butoxysilane, tri-tert-butoxysilane, triphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldiisopropoxysilane, di-sec-butyldibutyldi-n-butoxysilane, di-sec-butyldi-sec-butoxysilane, di-sec-butyldi-tert-butoxy silane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldi-ethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyldimethoxysilane can be given. These compounds may be used either individually or in combination of two or more.

Of these, particularly preferable compounds as the compound 1 are methyltrimethoxysilane, methyltriethoxysilane, methyltri-n-propoxysilane, methyltripropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, and the like.

1.1.2 Compound 2

As examples of the monovalent organic group represented by $R^2$ in the formula (2), the groups illustrated as the groups R and $R^1$ in the formula (1) can be given.

As specific examples of the compound 2, tetramethoxysilane, tetraethoxysilane, tetra-n-propoxysilane, tetrapropoxysilane, tetra-n-butoxysilane, tetra-sec-butoxysilane, tetra-tert-butoxysilane, tetraphenoxysilane, and the like can be given. Of these, tetramethoxysilane and tetraethoxysilane are particularly preferable. These compounds may be used either individually or in combination of two or more.

1.1.3 Compound 3

As examples of the monovalent organic groups represented by $R^3$ to $R^6$ in the formula (3), the groups illustrated as the groups R and $R^1$ in the formula (1) can be given.

As examples of the compounds shown by the formula (3) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy- 1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compound 3 shown by the formula (3) in which $R^7$ is represented by $—(CH_2)_m—$, bis(trimethoxysilyl)methane, bis(triethoxysilyl)methane, bis(tri-n-propoxysilyl)methane, bis(tripropoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tripropoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(dipropoxymethylsilyl)-1-(tripropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(dipropoxymethylsilyl)-2-(tripropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(dipropoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(dipropoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tripropoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tripropoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tripropoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like can be given.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable. The compounds 1 to 3 may be used either individually or in combination of two or more.

When subjecting the compounds 1 to 3 to hydrolysis and partial condensation, water may be preferably used in an amount of 0.1 to 100 mol for one mol of the group represented by $R^1O—$, $R^2O—$, $R^4O—$, or $R^5O—$ in the formulas (1) to (3). The complete hydrolysis-condensation product used in the invention is defined as a product in which 100% of the groups shown by $R^1O—$, $R^2O—$, $R^4O—$, or $R^5O—$ in the condensate are hydrolyzed to become OH groups and are completely condensed.

1.2 Component (B)

Next, the component (B) will be discussed. The component (B) is a polycarbosilane having a main chain structure shown by the formula $—(Si—CH_2)_x—$ (wherein x is an integer of two or more) and containing the structure shown by the following formula (4), the structure shown by the following formula (5), the structure shown by the following formula (6), and the structure shown by the following formula (7) (hereinafter referred to as "compound 4"). The component (B) condenses with the component (A) to form an Si—O—Si bond.

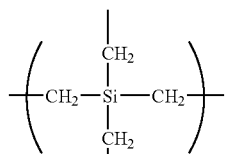

(4)

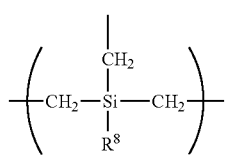

(5)

wherein $R^8$ is selected from the group consisting of a hydrogen atom, a halogen atom, a hydroxyl group, an alkoxyl group, and an acyloxyl group.

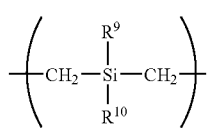

(6)

wherein $R^9$ and $R^{10}$ are individually selected from the group consisting of a hydrogen atom, a halogen atom, a hydroxyl group, an alkoxyl group, and an acyloxyl group.

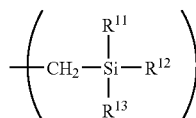

(7)

wherein $R^{11}$ to $R^{13}$ are individually selected from the group consisting of a hydrogen atom, a halogen atom, a hydroxyl group, an alkoxyl group, and an acyloxyl group.

As examples of the alkoxyl group, a methoxyl group, an ethoxyl group, a propoxyl group, a butoxyl group, and the like can be given. As examples of the acyloxyl group, an acetoxyl group, a benzyloxyl group, and the like can be given.

The molecule of the component (B) contains the structure shown by the formula (4) in an amount of preferably 5 to 20 mol % (more preferably 5 to 15 mol %), the structure shown by the formula (5) in an amount of preferably 5 to 20 mol % (more preferably 5 to 10 mol %), the structure shown by the formula (6) in an amount of preferably 20 to 50 mol % (more preferably 25 to 45 mol %), and the structure shown by the formula (7) in an amount of preferably 30 to 60 mol % (more preferably 35 to 50 mol %). The content of the structures shown by the formulas (4) to (7) in the above range ensures easy control of production of silanol groups by hydrolysis and the condensation reaction of the silanol groups, leading to easy production of the polymer with the target degree of branching and molecular weight.

The component (B) may not contain a silicon atom other than the silicon atoms included in the structures shown by the above formulas (4) to (7) in the molecule.

The content of the above structures in the component (B) can be identified by the result of $^{29}$Si-NMR spectrum analysis, for example.

As the mixing ratio of the component (A) and the component (B), the amount of the component (B) is preferably 1 to 1,000 parts by weight, more preferably 5 to 200 parts by weight, and still more preferably 5 to 100 parts by weight for 100 parts by weight of the component (A) (complete hydrolysis-condensation product). If the amount of the component (B) is less than 1 part by weight, the film formed from the composition may not exhibit sufficient chemical resistance. If the amount is more than 1,000 parts by weight, the film may not have the target low dielectric constant.

The polystyrene-reduced weight average molecular weight of the component (B) is preferably 700 to 10,000, more preferably 750 to 5,000, and still more preferably 750 to 3,000. If the polystyrene-reduced weight average molecular weight of the component (B) is more than 10,000, a uniform film may not be formed due to phase separation with the component (A).

When producing the hydrolysis-condensation product contained in the insulating-film-forming composition of this embodiment, the hydrolysis and condensation of the component (A) using the compound 4 as the component (B) in the presence of the basic catalyst (C) and the component (B) ensures hydrolysis and condensation among the molecules of the component (A) and, at the same time, hydrolysis and condensation of the component (B) with the polysiloxane originating from the component (A). These hydrolysis-condensation reactions produce a hydrolysis-condensation product having a structure in which the polymer having the component (B) (polycarbosilane) as a nucleus is incorporated into a three-dimensional structure of the polysiloxane originating from the component (A) (hydrolysis group-containing silane monomer). Incorporation of the above hydrolysis-condensation product in the insulating-film-forming composition ensures production of an insulating film having a low dielectric constant, high mechanical strength, excellent adhesion, superior chemical resistance, and freedom from film phase separation.

1.3 Basic Catalyst (C)

When producing the hydrolysis-condensation product contained in the film-forming composition, it is possible to increase the degree of branching of the molecular chain of the molecular structure of the hydrolysis-condensation product and increase the molecular weight of the hydrolysis-condensation product by using the basic catalyst (C). This enables a hydrolysis-condensation product having the above-mentioned structure to be obtained.

As examples of the basic catalyst (C), methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmetanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanoleamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(arninoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, ammonia, sodium hydroxide, potassium hydroxide, barium hydroxide, calcium hydroxide, and the like can be given.

As the basic catalyst (C), a nitrogen-containing compound shown by the following formula (8) (hereinafter may be referred to as "compound 5") is preferable.

$(X^1X^2X^3X^4N)_{a'}Y$          (8)

wherein $X^1$, $X^2$, $X^3$, and $X^4$ individually represent a hydrogen atom, an alkyl group having 1 to 20 carbon atoms (preferably a methyl group, an ethyl group, a propyl group, a butyl group, a hexyl group, and the like), a hydroxyalkyl group (preferably a hydroxyethyl group and the like), an aryl group (preferably a phenyl group and the like), or an arylalkyl group (preferably a phenyl methyl group and the like); Y represents a halogen atom (preferably a fluorine atom, a chlorine atom, a bromine atom, or an iodine atom) or an anionic group with a valence of 1 to 4 (preferably a hydroxyl group and the like); and a' indicates an integer from 1 to 4.

Specific examples of the compound 5 include tetramethylammonium hydroxide, tetraethylammonium hydroxide, tetra-n-propylammonium hydroxide, tetraisopropylammonium hydroxide, tetra-n-butylammonium hydroxide, tetraisobutylammonium hydroxide, tetra-tert-butylammonium hydroxide, tetrapentylammonium hydroxide, tetrahexylammonium hydroxide, tetraheptylammonium hydroxide, tetraoctylammonium hydroxide, tetranonylammonium hydroxide, tetradecylammonium hydroxide, tetraundecylammonium hydroxide, tetradodecylammonium hydroxide, tetramethylammonium bromide, tetramethylammonium chloride, tetraethylammonium bromide, tetraethylammonium chloride, tetra-n-propylammonium bromide, tetra-n-propylammonium chloride, tetra-n-butylammonium bromide, tetra-n-butylammonium chloride, hexadecyltrimethylammonium hydroxide, n-hexadecyltrimethylammonium bromide, n-octadecyltrimethylammonium hydroxide, n-octadecyltrimethylammonium bromide, cetyltrimethylammonium chloride, stearyltrimethylammonium chloride, benzyltrimethylammonium chloride, didecyldimethylammonium chloride, distearyldimethylammonium chloride, tridecylmethylammonium chloride, tetrabutylammonium hydrogen sulfate, tributylmethyl ammonium bromide, trioctylmethylammonium chloride, trilaurylmethylammonium chloride, benzyltrimethylammonium hydroxide, benzyltriethylammonium bromide, benzyltributylammonium bromide, phenyltrimethylammonium bromide, choline, and the like. Of these, tetramethylammonium hydroxide, tetraethylammonium hydroxide, tetra-n-propylammonium hydroxide, tetra-n-butylammonium hydroxide, tetramethylammonium bromide, tetramethylammonium chloride, tetraethylammonium bromide, tetraethylammonium chloride, tetra-n-propylammonium bromide, and tetra-n-propylammonium chloride are particularly preferable. These compounds may be used either individually or in combination of two or more.

The amount of the basic catalyst (C) used is usually 0.0001 to 1 mol, and preferably 0.001 to 0.1 mol for one mol of the component (A) (the total amount of the compounds 1 to 3).

1.4 Method for Preparing Specific Hydrolysis-Condensation Product

The specific hydrolysis-condensation product is obtained by hydrolysis-condensation of the component (A) in the presence of the component (B) and the basic catalyst (C).

In the reaction, the component (A) may be hydrolyzed in a state in which the component (A) and the component (B) are dissolved in an organic solvent. As examples of the organic solvent which may be used, alcohols such as methanol, ethanol, n-propanol, isopropanol, n-butanol, isobutanol, sec-butanol, and tert-butanol; polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, and ethylene glycol monobutyl ether; ether solvents such as ethyl ether, isopropyl ether, n-butyl ether, n-hexyl ether, 2-ethylhexyl ether, dioxolane, 4-methyldioxolane, dioxane, dimethyldioxane, ethylene glycol monomethyl ether, ethylene glycol dimethyl ether, ethylene glycol monoethyl ether, and ethylene glycol diethyl ether; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclopentanone, cyclohexanone, cycloheptanone, cyclooctanone, 2-hexanone, methyl cyclohexanone, 2,4-pentanedione, acetonylacetone, and diacetone alcohol; and the like can be given.

The total concentration of the component (B) and the component (A) in the organic solvent is preferably 1 to 30 wt %.

The hydrolysis-condensation reaction temperature is from 0° C. to 100° C., and preferably from 20° C. to 80° C., and the reaction time is from 30 to 1,000 minutes, and preferably from 30 to 180 minutes.

Although there are no specific limitations to the order of adding each component, a method of adding a solution of the component (A) in the organic solvent and a solution of the component (B) in the organic solvent to a mixture of the basic catalyst (C) and the organic solvent is preferably used.

The polystyrene-reduced weight average molecular weight of the specific hydrolysis-condensation product is preferably from 1,500 to 500,000, more preferably from 2,000 to 200,000, and still more preferably from 2,000 to 100,000. If the polystyrene-reduced weight average molecular weight of the specific hydrolysis-condensation product is less than 1,500, the target dielectric constant may not be achieved. If more than 500,000, the coating film may become nonuniform.

1.5 Organic Solvent

As the organic solvent contained in the insulating-film-forming composition of the this embodiment, at least one solvent selected from the group consisting of alcohol solvents, ketone solvents, amide solvents, ether solvents, ester solvents, aliphatic hydrocarbon solvents, aromatic solvents, and halogen-containing solvents can be given.

Examples of the alcohol solvents include: monohydric alcohols such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like. These alcohol solvents may be used either individually or in combination of two or more.

Examples of the ketone solvents include acetone, methyl ethyl ketone, methyl-n-propyl ketone, methyl-n-butyl ketone, diethyl ketone, methylisobutyl ketone, methyl-n-pentyl ketone, ethyl-n-butyl ketone, methyl-n-hexyl ketone, diisobutyl ketone, trimethylnonanone, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like. These ketone solvents may be used either individually or in combination of two or more.

Examples of the amide solvents include nitrogen-containing solvents such as N,N-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like. These amide solvents may be used either individually or in combination of two or more.

Examples of the ether solvents include ethyl ether, isopropyl ether, n-butyl ether, n-hexyl ether, 2-ethylhexyl ether, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like. These ether solvents may be used either individually or in combination of two or more.

Examples of the ester solvents include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like. These ester solvents may be used either individually or in combination of two or more.

Examples of the aliphatic hydrocarbon solvents include n-pentane, isopentane, n-hexane, isohexane, n-heptane, isoheptane, 2,2,4-trimethylpentane, n-octane, isooctane, cyclohexane, methylcyclohexane, and the like. These aliphatic hydrocarbon solvents may be used either individually or in combination of two or more.

Examples of the aromatic hydrocarbon solvents include benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, and the like. These aromatic hydrocarbon solvents may be used either individually or in combination of two or more. Examples of the halogen-containing solvent include dichloromethane, chloroform, fluorocarbon, chlorobenzene, dichlorobenzene, and the like.

In the invention, it is preferable to use an organic solvent having a boiling point of less than 150° C. As the type of solvent, an alcohol solvent, a ketone solvent, and an ester solvent are particularly preferable. It is preferable to use one or more of these solvents.

The organic solvent used for the synthesis of the specific hydrolysis-condensation product, or a solvent replaced by a desired organic solvent after completion of synthesis of the specific hydrolysis-condensation product may be used as the organic solvent.

1.6 Other Additives

Additives such as an organic polymer, surfactant, and the like may be added to the insulating-film-forming composition of this embodiment. These additives may be added to the solvent in which either the component (A) or the component (B) is dissolved or dispersed before mixing the component (A) and the component (B).

1.6.1 Organic Polymer

As examples of the organic polymer, a polymer having a sugar chain structure, vinylamide polymer, (meth)acrylic polymer, aromatic vinyl compound polymer, dendrimer, polyimide, polyamic acid, polyarylene, polyamide, polyquinoxaline, polyoxadiazole, fluorine-containing polymer, polymer having a polyalkylene oxide structure, and the like can be given.

As the polyalkylene oxide structure, a polymethylene oxide structure, polyethylene oxide structure, polypropylene oxide structure, polytetramethylene oxide structure, polybutylene oxide structure, and the like can be given.

As specific examples of the polymer having a polyalkylene oxide structure, ether compounds such as polyoxymethylene alkyl ether, polyoxyethylene alkyl ether, polyoxyethylene alkyl phenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; and ether-ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester, and the like can be given.

As a polyoxyethylene polyoxypropylene block copolymer, compounds having the following block structure can be given.

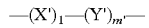

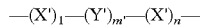

wherein X' represents a group —$CH_2CH_2O$—, Y' represents a group —$CH_2CH(CH_3)O$—, l represents an integer from 1 to 90, m' represents an integer from 10 to 99, and n represents an integer from 0 to 90.

Of these, the ether compounds such as polyoxyethylene alkyl ethers, polyoxyethylene polyoxypropylene block copolymers, polyoxyethylene polyoxypropylene alkyl ethers, polyoxyethylene glycerides, polyoxyethylene sorbitan fatty acid esters, polyoxyethylene sorbitol fatty acid esters, and the like are preferable. These organic polymers may be used either individually or in combination of two or more.

1.6.2 Surfactant

As examples of the surfactant, a nonionic surfactant, an anionic surfactant, a cationic surfactant, an amphoteric surfactant, and the like can be given. As specific examples, a fluorine-containing surfactant, a silicone surfactant, a polyalkylene oxide surfactant, a poly(meth)acrylate surfactant, and the like can be given. Of these, the fluorine-containing surfactant and the silicone surfactant are preferable.

The surfactant is used in an amount of usually 0.00001 to 1 part by weight for 100 parts by weight of the obtained polymer. The surfactants may be used either individually or in combination of two or more.

2. Film Formation Method

A method of forming a film (insulating film) according to one embodiment of the invention includes applying the film-forming composition to a substrate to form a coating film and subjecting the film to a heat treatment.

As examples of the substrate to which the film-forming composition is applied, Si-containing layers such as Si, $SiO_2$, SiN, SiC, and SiCN can be given. As the method for applying the film-forming composition to the substrate, a coating method such as spin coating, dip coating, roll coating, or spray coating may be used. After applying the film-forming composition to the substrate, the solvent is removed to form the coating film. A coating film with a dry thickness of 0.05 to 2.5 μm is obtained by single application, and a coating film with a dry thickness of 0.1 to 5.0 μm is obtained by double application. A silica-based film may be formed by subjecting the resulting coating film to a curing treatment.

As the curing treatment, heating, electron beam radiation, ultraviolet irradiation, plasma treatment, and the like can be given.

When heating is applied for curing, the coating film is heated at 80° C. to 450° C. in an inert gas atmosphere or under reduced pressure. A hot plate, oven, furnace, or the like may be used for heating. Heating may be performed in an inert gas atmosphere or under reduced pressure.

An appropriate measure such as step-wise heating, selection of heating atmosphere such as use of nitrogen, air, oxygen, reduced pressure, etc., may be optionally employed to control the curing rate of the coating film. A silica-based film can be produced by these steps.

3. Silica-Based Film (Silica-Based Insulating Film)

Since the silica-based film according to one embodiment of the invention has a low dielectric constant and excellent surface flatness, the silica-based film is particularly useful as an interlayer dielectric for a semiconductor device such as an LSI, system LSI, DRAM, SDRAM, RDRAM, or D-RDRAM. Moreover, the silica-based film can be suitably used in semiconductor device applications such as an etching stopper film, a protective film such as a surface coating film for a semiconductor device, an intermediate layer used in the semiconductor device manufacturing process using a multilayer resist, an interlayer dielectric for a multilayer interconnection substrate, a protective film and an insulating film for a liquid crystal display element, and the like.

4. Examples

The invention is described below in more detail by way of examples. The invention, however, should not be limited to these examples. In the examples and comparative examples, "part" and "%" respectively indicate "part by weight" and "wt %" unless otherwise indicated.

4.1 Evaluation Method

Each item was evaluated as follows.

4.1.1 Relative Dielectric Constant

The film-forming composition was applied to an 8-inch silicon wafer by spin coating. The coating film was dried on a hot plate at 90° C. for three minutes and in a nitrogen atmosphere at 200° C. for three minutes, and baked for one hour in a longitudinal furnace at 420° C. under reduced pressure of 50 mTorr. An aluminum electrode pattern was formed on the resulting film by vapor deposition to obtain a relative dielectric constant measurement sample. The relative dielectric constant of the sample was measured by a CV method at a frequency of 100 kHz using an electrode "HP 16451B" and a precision LCR meter "HP 4284A", both manufactured by Yokogawa-Hewlett Packard Co., Ltd.

4.1.2 Evaluation of Hardness and Modulus of Elasticity (Young's Modulus) of Insulating Film A Berkovich type indenter was installed in a nanohardness tester (Nanoindentator XP) manufactured by MTS, and the universal hardness of the insulating film was determined. The modulus of elasticity was measured by a continuous rigidity measurement method.

4.1.3 Storage Stability

The film-forming composition stored at 40° C. for 30 days was applied to a substrate by spin coating. The substrate was dried on a hot plate at 90° C. for three minutes and in a nitrogen atmosphere at 200° C. for three minutes, and baked for one hour in a longitudinal furnace at 420° C. under reduced pressure of 50 mTorr. The thickness of the coating film obtained in this manner was measured at 50 points on the coating film using an optical film-thickness meter ("Spectra Laser 200" manufactured by Rudolph Technologies). The storage stability of the film was evaluated by the rate of film thickness increase which was determined by applying the measured thickness to the following formula.

Rate of film thickness increase (%)=((film thickness after storage)−(film thickness before storage))/(film thickness before storage)×100

A: The rate of film thickness increase was 4% or less.
B: The rate of film thickness increase was more than 4%.

4.1.4 Chemical Resistance

An 8-inch wafer on which a silica-based film was formed was immersed in a 0.2% diluted hydrofluoric acid aqueous solution at room temperature for one minute and a change in thickness of the silica-based film before and after immersion was observed. The chemical resistance was judged to be excellent when the residual film rate defined below was 99% or more.

Residual film rate (%)=(film thickness after immersion)/(film thickness before immersion)×100

A: Residual film rate was 99% or more.
B: Residual film rate was less than 99%.

4.1.5. Confirmation of Phase Separation in Film

The section of the insulating film was processed by a convergent ion beam method for preparing specimen observation, of which the external appearance was inspected using TEM at a magnification of 18,000. The results are grouped as follows.

A: A uniform coating film was confirmed by inspection of the shape of the section.
B: Scattered island-like domain phase separation was observed in the film.

4.2 Preparation of Film-Forming Composition

4.2.1 Example 1

2.58 g of a 40% methylamine aqueous solution, 178.16 g of ultrapure water, and 435.34 g of ethanol were put into a flask made of quartz equipped with a condenser. The mixture was stirred at 60° C. Then, 41.07 g of methyltrimethoxysilane, 26.92 g of tetraethoxysilane, and 15.93 g of polycarbosilane (9) (Mw=1,300) having the structure described shown in Table 1 at the ratio shown in Table 1 were added to the mixture. The mixture was stirred at 60° C. for six hours to obtain a reaction solution containing a hydrolysis-condensation product with a polystyrene-reduced weight average molecular weight of 45,000. After the reaction solution was cooled to room temperature, 613.50 g of propylene glycol monopropyl ether and 22.96 g of a 20% acetic acid aqueous solution were added. The reaction solution was concentrated under reduced pressure until the solid content was 10% to obtain a film-forming composition 1.

4.2.2 Example 2

52.15 g of a 20% tetrapropylammonium hydroxide aqueous solution, 81.5 g of ultrapure water, and 470.36 g of isopropanol were put into a flask made of quartz equipped with a condenser. The mixture was stirred at 60° C. Then, 26.24 g of methyltrimethoxysilane, 50.93 g of tetrapropoxysilane, and 18.82 g of polycarbosilane (10) (Mw=840) having the structure shown in Table 2 at the ratio shown in Table 2 were added to the mixture. The mixture was stirred at 60° C. for four hours to obtain a reaction solution containing a hydrolysis-condensation product with a polystyrene-reduced weight average molecular weight of 55,000. After the reaction solution was cooled to room temperature, 551.86 g of propylene glycol monopropyl ether and 35.42 g of a 20% acetic acid aqueous solution were added. The reaction solution was concentrated under reduced pressure until the solid content was 10% to obtain a film-forming composition 2.

TABLE 1

| Structure | | | |
|---|---|---|---|
| $\left(-\text{CH}_2-\underset{\underset{\text{CH}_2}{\overset{\overset{\text{CH}_3}{\mid}}{\mid}}}{\text{Si}}-\text{CH}_2-\right)$ | $\left(-\text{CH}_2-\underset{\underset{\text{OCH}_2\text{CH}_3}{\mid}}{\overset{\overset{\text{CH}_2}{\mid}}{\text{Si}}}-\text{CH}_2-\right)$ | $\left(-\text{CH}_2-\underset{\underset{\text{OCH}_2\text{CH}_3}{\mid}}{\overset{\overset{\text{OCH}_2\text{CH}_3}{\mid}}{\text{Si}}}-\text{CH}_2-\right)$ | $\left(-\text{CH}_2-\underset{\underset{\text{OCH}_2\text{CH}_3}{\mid}}{\overset{\overset{\text{OCH}_2\text{CH}_3}{\mid}}{\text{Si}}}-\text{OCH}_2\text{CH}_3\right)$ |
| Ratio (mol %) 9 | 7 | 32 | 52 |

(9)

TABLE 2

| Structure |
|---|
| 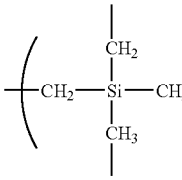 |

| Ratio (mol %) | 11 | 8 | 35 | 46 |
|---|---|---|---|---|

(10)

4.2.3 Example 3

5.80 g of a 25% tetramethylammonium hydroxide aqueous solution, 110.30 g of ultrapure water, and 548.08 g of ethanol were put into a flask made of quartz equipped with a condenser. The mixture was stirred at 60° C. Then, 5.70 g of dimethyldimethoxysilane, 16.15 g of methyltrimethoxysilane, 10.83 g of tetramethoxysilane, and 3.14 g of polycarbosilane (11) (Mw=1,050) having the structure shown in Table 3 at the ratio shown in Table 3 were continuously added over one hour. The mixture was stirred at 60° C. for two hours to obtain a reaction solution containing a hydrolysis-condensation product with a polystyrene-reduced weight average molecular weight of 40,000. After the reaction solution was cooled to room temperature, 658.38 g of propylene glycol monopropyl ether and 10.98 g of 20% acetic acid aqueous solution were added. The reaction solution was concentrated under reduced pressure until the solid content was 10% to obtain a film-forming composition 3.

and 95.27 g of polycarbosilane (12) (Mw=1,480) having the structure shown in Table 4 at the ratio shown in Table 4 were dissolved in 425.50 g of propylene glycol monoethyl ether. The mixture was stirred using a three-one motor to stabilize the temperature at 55° C. Then, 104.83 g of ion-exchanged water, in which 0.44 g of oxalic acid had been dissolved, was added over one hour. The mixture was allowed to react at 55° C. for three hours. After obtaining a reaction solution containing a hydrolysis-condensation product with a polystyrene-reduced weight average molecular weight of 2,400, 528.59 g of propylene glycol monoethyl ether was added, and the reaction solution was cooled to room temperature. The reaction solution was concentrated under reduced pressure until the solid content was 10% to obtain a film-forming composition 4.

TABLE 3

| Structure |
|---|
| 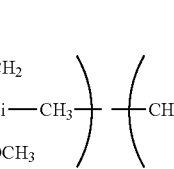 |

| Ratio (mol %) | 15 | 10 | 42 | 33 |
|---|---|---|---|---|

(11)

4.2.4 Example 4

In a flask made of quartz equipped with a condenser, 58.04 g of methyltrimethoxysilane, 16.22 g of tetramethoxysilane,

TABLE 4

| Structure | | | |
|---|---|---|---|
| ‑(‑CH₂‑Si(CH₂)(CH₂)‑CH₂‑)‑ | ‑(‑CH₂‑Si(CH₂)(O‑C(=O)‑CH₃)‑CH₂‑)‑ | ‑(‑CH₂‑Si(O‑C(=O)‑CH₃)(O‑C(=O)‑CH₃)‑CH₂‑)‑ | ‑(‑CH₂‑Si(O‑C(=O)‑CH₃)(O‑C(=O)‑CH₃)‑O‑C(=O)‑CH₃)‑ |
| Ratio (mol %) 7 | 7 | 41 | 45 |

(12)

4.2.5 Example 5

In a flask made of quartz equipped with a condenser, 82.14 g of methyltrimethoxysilane, 38.34 g of tetramethoxysilane, and 25.10 g of polycarbosilane (13) (Mw=840) having the structure shown in Table 5 at the ratio shown in Table 5 were dissolved in 385.65 g of propylene glycol monoethyl ether. Then, 89.85 g of ion-exchanged water was added, and the solution was stirred at room temperature for one hour. Then, a solution in which 0.071 g of tetrakis(acetylacetonate)titanium was dissolved in 42.85 g of propylene glycol monoethyl ether was added. The mixture was allowed to react at 50° C. for three hours. After obtaining a reaction solution containing a hydrolysis-condensation product with a polystyrene-reduced weight average molecular weight of 1,650, 518.35 g of propylene glycol monoethyl ether was added, and the reaction solution was cooled to room temperature. The reaction solution was concentrated under reduced pressure until the solid content was 10% to obtain a film-forming composition 5.

reaction solution was cooled to room temperature, 621.86 g of propylene glycol monopropyl ether and 20.95 g of a 20% acetic acid aqueous solution were added. The reaction solution was concentrated under reduced pressure until the solid content was 10% to obtain a film-forming composition 6.

TABLE 6

| Structure | |
|---|---|
| ‑(‑CH₂‑Si(CH₃)(CH₃)‑CH₂‑)‑ | ‑(‑CH₂‑Si(CH₃)(OCH₃)‑CH₂‑)‑ |
| Ratio (mol %) 40 | 60 |

(14)

TABLE 5

| Structure | | | |
|---|---|---|---|
| ‑(‑CH₂‑Si(CH₂)(CH₂)‑CH₂‑)‑ | ‑(‑CH₂‑Si(CH₂)(OCH₃)‑CH₃)‑ | ‑(‑CH₂‑Si(OCH₃)(OCH₃)‑CH₃)‑ | ‑(‑CH₂‑Si(OCH₃)(OCH₃)‑OCH₃)‑ |
| Ratio (mol %) 11 | 8 | 35 | 46 |

(13)

4.2.6 Comparative Example 1

2.36 g of a 40% methylamine aqueous solution, 162.57 g of ultrapure water, and 459.29 g of ethanol were put into a flask made of quartz equipped with a condenser. The mixture was stirred at 80° C. Then, 41.07 g of methyltrimethoxysilane, 26.92 g of tetraethoxysilane, and 2.36 g of polycarbosilane (14) (Mw=1,200) having the structure shown in Table 6 at the ratio shown in Table 6 were added. The mixture was stirred at 80° C. for eight hours to obtain a reaction solution containing a hydrolysis-condensation product with a polystyrene-reduced weight average molecular weight of 48,000. After the

4.2.7 Comparative Example 2

58.75 g of a 20% tetrapropylammonium hydroxide aqueous solution, 91.82 g of ultrapure water, and 439.2 g of isopropanol were put into a flask made of quartz equipped with a condenser. The mixture was stirred at 60° C. Then, 37.48 g of methyltrimethoxysilane and 72.75 g of tetrapropoxysilane were added. The mixture was stirred at 60° C. for six hours to obtain a reaction solution containing a hydrolysis-condensation product with a polystyrene-reduced weight average molecular weight of 60,000. After the reaction solution was cooled to room temperature, 531.02 g of propylene glycol monopropyl ether and 39.90 g of a 20% acetic acid aqueous solution were added. The reaction solution was concentrated under reduced pressure until the solid content was 10% to obtain a film-forming composition 7.

4.2.8 Comparative Example 3

In a flask made of quartz equipped with a condenser, 125.49 g of polycarbosilane (15) (Mw=840) having the structure shown in Table 7 at the ratio shown in Table 7 were dissolved in 487.33 g of propylene glycol monoethyl ether. The mixture was stirred using a three-one motor to stabilize the temperature at 55° C. Then, 88.63 g of ion-exchanged water, in which 0.36 g of oxalic acid had been dissolved, was added over one hour. The mixture was allowed to react at 55° C. for three hours. After obtaining a reaction solution containing a hydrolysis-condensation product with a polystyrene-reduced weight average molecular weight of 2,800, 572.70 g of propylene glycol monoethyl ether was added, and the reaction solution was cooled to room temperature. The reaction solution was concentrated under reduced pressure until the solid content was 10% to obtain a film-forming composition 8.

TABLE 7

| Structure |
|---|
| $\left(-CH_2-\underset{\underset{CH_2}{|}}{\overset{\overset{CH_3}{|}}{Si}}-CH_2-\right)$ $\left(-CH_2-\underset{\underset{OCH_3}{|}}{\overset{\overset{CH_2}{|}}{Si}}-CH_3-\right)$ $\left(-CH_2-\underset{\underset{OCH_3}{|}}{\overset{\overset{OCH_3}{|}}{Si}}-CH_3-\right)$ $\left(-CH_2-\underset{\underset{OCH_3}{|}}{\overset{\overset{OCH_3}{|}}{Si}}-OCH_3\right)$ |
| Ratio (mol %): 11    8    35    46 |

(15)

4.2.9 Comparative Example 4

30 g of the insulating-film-forming composition prepared in Comparative Example 3 with a solid content of 10% was added to 70 g of the insulating-film-forming composition prepared in Comparative Example 2 with a solid content of 10%. The mixture was stirred at 25° C. for one hour to obtain a film-forming composition 9.

4.3 Evaluation Results

The film-forming compositions 1 to 9 prepared in Examples 1 to 5 and Comparative Examples 1 to 4 were evaluated for the relative dielectric constant, modulus of elasticity, hardness, chemical resistance, storage stability, and observation of section. The evaluation results are shown in Table 8.

TABLE 8

|  | Example | | | | | Comparative Example | | | |
|---|---|---|---|---|---|---|---|---|---|
|  | 1 | 2 | 3 | 4 | 5 | 1 | 2 | 3 | 4 |
| Relative dielectric constant | 2.3 | 2.2 | 2.3 | 3.0 | 2.9 | 2.5 | 2.2 | 4.7 | 3.5 |
| Modulus of elasticity (GPa) | 4.5 | 4.8 | 3.6 | 11.4 | 9.2 | 5.1 | 3.4 | 5.0 | 4.1 |
| Hardness (GPa) | 0.62 | 0.70 | 0.55 | 1.72 | 1.56 | 0.71 | 0.67 | 0.72 | 0.69 |
| Chemical resistance | A | A | A | A | A | A | B | A | A |
| Storage stability | A | A | A | A | A | B | A | B | B |
| Observation of section | A | A | A | A | A | A | A | A | B |

As can be seen from Table 8, it is confirmed that the film-forming compositions of Examples 1 to 5 had a lower relative dielectric constant than the film-forming compositions of Comparative Examples 3 and 4 and had an improved modulus of elasticity and hardness. It was also confirmed that the film-forming compositions of Examples 1 to 5 exhibited better storage stability than the film-forming compositions of Comparative Examples 3 and 4.

Comparison of Comparative Example 1 and Example 1, which are experiments carried out in the same manner except for the type of polycarbosilane used, confirmed that the polycarbosilane which has the structure of the invention used in Example 1 can produce a film-forming composition with excellent chemical resistance and storage stability.

In Comparative Example 2, in which the hydrolysis and condensation reaction was carried out in the absence of the polycarbosilane, deterioration of chemical resistance of the resulting film-forming composition was observed, indicating the advantage of the hydrolysis and condensation in the presence of the polycarbosilane.

Comparative Example 3, in which the hydrolysis and condensation reaction was carried out for only the polycarbosilane having the structure of the invention, confirmed that the resulting film-forming composition had a high relative dielectric constant and inferior storage stability, indicating that the hydrolysis condensation of a silane compound in the presence of the polycarbosilane is useful.

Comparative Example 4, in which the film-forming composition was prepared by mixing the hydrolysis-condensation products obtained in Comparative Examples 2 and 3, confirmed that the resulting film-forming composition had poor storage stability and phase separation was observed on the section, indicating that the hydrolysis and condensation of the silane compound in the presence of the polycarbosilane is useful.

Therefore, a silica-based film obtained by the invention has excellent mechanical strength, low relative dielectric constant, and excellent chemical resistance and storage stability, and can be suitably used as an interlayer dielectric of a semiconductor device or the like.

What is claimed is:

1. An insulating-film-forming composition comprising an organic solvent and a hydrolysis-condensation product which is obtained by hydrolysis and condensation of a component (A) in the presence of a component (B), the component (A) being at least one silane compound selected from a group consisting of compounds shown by the following formulas (1) to (3)

$$R_a Si(OR^1)_{4-a} \quad (1)$$

wherein R represents a hydrogen atom, a fluorine atom, or a monovalent organic group, $R^1$ represents a monovalent organic group, and a represents an integer of 1 or 2, $$Si(OR^2)_4 \quad (2)$$

wherein $R^2$ represents a monovalent organic group, $$R^3{}_b(R^4O)_{3-b}Si-(R^7)_d-Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a $-(CH_2)_m-$ group (wherein m represents an integer from 1 to 6), and d represents 0 or 1, the component (B) being a polycarbosilane having a main chain structure shown by the formula $-(Si-CH_2)_x-$ (wherein x is an integer of two or more) and containing a structure shown by the following formula (4), a structure shown by the following formula (5), a structure shown by the following formula (6), and a structure shown by the following formula (7),

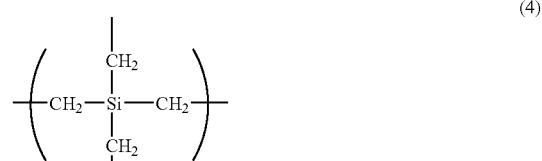

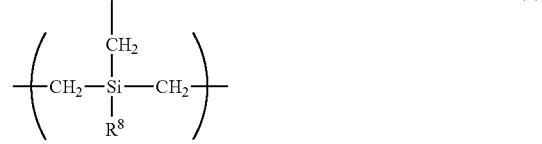

wherein $R^8$ is selected from the group consisting of a hydrogen atom, a halogen atom, a hydroxyl group, an alkoxyl group, and an acyloxyl group,

wherein $R^9$ and $R^{10}$ are individually selected from the group consisting of a hydrogen atom, a halogen atom, a hydroxyl group, an alkoxyl group, and an acyloxyl group,

wherein $R^{11}$ to $R^{13}$ are individually selected from the group consisting of a hydrogen atom, a halogen atom, a hydroxyl group, an alkoxyl group, and an acyloxyl group, wherein the component (B) contains in its molecule 5 to 20 mol % of the structure shown by formula (4), 5 to 20 mol % of the structure shown by formula (5), 20 to 50 mol % of the structure shown by formula (6), and 30 to 60 mol % of the structure shown by formula (7).

2. The insulating-film-forming composition as defined in claim 1, wherein the amount of the component (B) is 1 to 1,000 parts by weight for 100 parts by weight of the component (A), converted into a complete hydrolysis-condensation product.

3. The insulating-film-forming composition as defined in claim 1, wherein the component (B) has a polystyrene-reduced weight average molecular weight of 700 to 10,000.

4. The insulating-film-forming composition as defined in claim 1, wherein the component (B) does not contain a silicon atom other than the silicon atoms included in the structures shown by the formulas (4) to (7) in the molecule.

5. The insulating-film-forming composition as defined in claim 1,
wherein the hydrolysis and condensation are carried out in the presence of a basic catalyst, an acidic catalyst, or a metal chelate catalyst.

6. The insulating-film-forming composition as defined in claim 5,
wherein the basic catalyst is a nitrogen-containing compound shown by formula (8), $$(X^1X^2X^3X^4N)_{a'}{}^+Y^- \tag{8}$$

wherein $X^1$, $X^2$, $X^3$, and $X^4$ are individually selected from the group consisting of a hydrogen atom, an alkyl group having 1 to 20 carbon atoms, a hydroxyalkyl group, an aryl group, and an arylalkyl group; Y represents a halogen atom or an anionic group with a valence of 1 to 4; and a' indicates an integer from 1 to 4.

7. The insulating-film-forming composition as defined in claim 6, wherein said basic catalyst is present in an amount of from 0.0001 to 1 mol, per 1 mol of component (A).

8. A method of forming a silica-based insulating film, comprising:
applying the insulating-film-forming composition as defined in claim 1 to a substrate to form a coating film; and
curing the coating film by at least one curing treatment selected from heating, electron beam irradiation, ultraviolet irradiation, and oxygen plasma treatment.

9. A silica-based insulating film obtained by the method as defined in claim 8.

10. The insulating-film-forming composition as defined in claim 1, wherein said hydrolyzing and condensing is carried out at a temperature of from 0 to 100° C. and at a time of from 30 to 1,000 minutes.

11. The insulating-film-forming composition as defined in claim 1, wherein said component (A) and said component (B) are present in said organic solvent in an amount of from 1 to 30 wt %, relative to the amount of the solvent.

12. A method of producing an insulating-film-forming composition including a hydrolysis-condensation product and an organic solvent, comprising: obtaining the hydrolysis-condensation product by hydrolysis and condensation of a component (A) in the presence of a component (B), the component (A) being at least one silane compound selected from a group consisting of compounds shown by the following formulas (1) to (3),

wherein R represents a hydrogen atom, a fluorine atom, or a monovalent organic group, $R^1$ represents a monovalent organic group, and a represents an integer of 1 or 2, $$Si(OR^2)_4 \tag{2}$$

wherein $R^2$ represents a monovalent organic group,

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1, the component (B) being a polycarbosilane having a main chain structure shown by the formula —$(Si-CH_2)_x$— (wherein x is an integer of two or more) and containing a structure shown by the following formula (4), a structure shown by the following formula (5), a structure shown by the following formula (6), and a structure shown by the following formula (7),

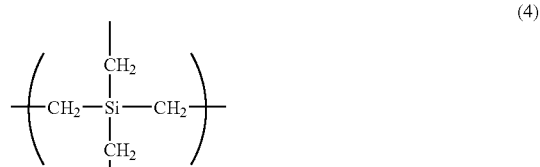

wherein $R^8$ is selected from the group consisting of a hydrogen atom, a halogen atom, a hydroxyl group, an alkoxyl group, and an acyloxyl group,

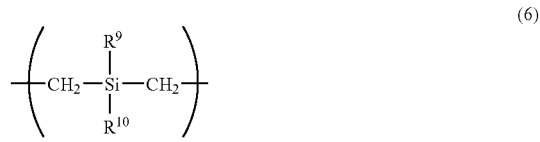

wherein $R^9$ and $R^{10}$ are individually selected from the group consisting of a hydrogen atom, a halogen atom, a hydroxyl group, an alkoxyl group, and an acyloxyl group,

wherein $R^{11}$ to $R^{13}$ are individually selected from the group consisting of a hydrogen atom, a halogen atom, a hydroxyl group, an alkoxyl group, and an acyloxyl group,
wherein the component (B) contains in its molecule 5 to 20 mol % of the structure shown by formula (4), 5 to 20 mol % of the structure shown by formula (5), 20 to 50 mol % of the structure shown by formula (6), and 30 to 60 mol % of the structure shown by formula (7).

13. The method of producing an insulating-film-forming composition as defined in claim 12,
wherein the amount of the component (B) is 1 to 1,000 parts by weight for 100 parts by weight of the component (A), converted into a complete hydrolysis-condensation product.

14. The method of producing an insulating-film-forming composition as defined in claim 12,
wherein the hydrolysis and condensation are carried out in the presence of a basic catalyst, an acidic catalyst, or a metal chelate catalyst.

15. The method of producing an insulating-film-forming composition as defined in claim 14, wherein the basic catalyst is a nitrogen-containing compound shown by formula (8), $$(X^1X^2X^3X^4N)_{a'}{}^+Y^- \qquad (8)$$

wherein $X^1$, $X^2$, $X^3$, and $X^4$ are individually selected from the group consisting of a hydrogen atom, an alkyl group having 1 to 20 carbon atoms, a hydroxyalkyl group, an aryl group, and an arylalkyl group; Y represents a halogen atom or an anionic group with a valence of 1 to 4; and a' indicates an integer from 1 to 4.

16. The method of producing an insulating-film-forming composition as defined in claim 15, wherein said basic catalyst is present in an amount of from 0.0001 to 1 mol, per 1 mol of component (A).

17. The method of producing an insulating-film-forming composition as defined in claim 12, wherein said hydrolyzing and condensing is carried out at a temperature of from 0 to 100° C. and at a time of from 30 to 1,000 minutes.

* * * * *